United States Patent [19]
Matsuoka et al.

[11] Patent Number: 5,192,221
[45] Date of Patent: Mar. 9, 1993

[54] SOCKET FOR ELECTRIC PART

[75] Inventors: Noriyuki Matsuoka, Kanagawa; Kazumi Uratsuji, Tokyo, both of Japan

[73] Assignee: Yamaichi Electric Co., Ltd., Tokyo, Japan

[21] Appl. No.: 757,532

[22] Filed: Sep. 11, 1991

[30] Foreign Application Priority Data

Sep. 12, 1990 [JP] Japan .................................. 2-243370

[51] Int. Cl.$^5$ .............................................. H01R 4/50
[52] U.S. Cl. ...................................... 439/342; 439/259
[58] Field of Search ............... 439/259, 260, 261, 262, 439/265, 266, 267, 268, 263, 264, 342, 270, 269

[56] References Cited

U.S. PATENT DOCUMENTS

| 3,539,970 | 11/1970 | Lockard et al. | 439/342 X |
| 5,002,499 | 3/1991 | Matsuoka | 439/259 X |

FOREIGN PATENT DOCUMENTS 1536462  1/1990  U.S.S.R. ............................... 439/264

OTHER PUBLICATIONS

IBM Technical Disclosure Bulletin, vol. 22, No. 4, Sep. 1979.

Primary Examiner—Larry I. Schwarz
Assistant Examiner—Khiem Nguyen
Attorney, Agent, or Firm—Wenderoth, Lind & Ponack

[57] ABSTRACT

A socket for an electric part including a socket body formed of an insulator material and having a plurality of contacts which are arranged in such a manner as to be able to contact with terminals of an electric part, and a movable plate disposed on the socket body in such a manner as to be able to laterally move along an upper surface thereof, a lateral movement of the movable plate in one direction forming a contacting state between each contact and each terminal of the electric part and a lateral movement thereof in the other direction forming a releasing state of the contacting state. A conductive shoe is interposed between the socket body and the movable plate and generating slippage when the movable plate is laterally moved.

4 Claims, 4 Drawing Sheets

SOCKET FOR ELECTRIC PART

BACKGROUND OF THE INVENTION

1. Field of the Invention

This invention relates to a socket for an electric part including a contacting and releasing movable plate, in which the generation of static electricity caused by lateral movement of the movable plate is effectively limited.

2. Brief Description of the Prior Art

Heretofore, as countermeasure means against static electricity in a socket for an electric part such as IC, etc., employment of a conductive resin for the socket body, means for irradiating ions to the socket body, etc. were practiced.

However, these conventional countermeasure means were unsuccessful, because the conductive resin had a problem that electric leakage occurs due to irregularity of insulation resistance values and the ion irradiation had a problem that a large scale equipment for irradiating ions was required.

Particularly, in a socket for an electric part of the type in which a contacting and releasing movable plate is slid on the upper surface of a socket body, generation of static electricity caused by sliding movement of the movable plate is significant and an effective countermeasure against static electricity is required.

The present invention has been accomplished in order to overcome the above problems.

SUMMARY OF THE INVENTION

It is therefore an object of the present invention to provide a socket for an electric part which is capable of effectively obviating the adverse effect of static electricity exerted on an electric part such as IC, etc.

To achieve the above object, in a socket for an electric part including a movable plate, a conductive shoe is interposed between the socket body and the movable plate so that the movable plate is laterally moved through slippage on the conductive shoe.

According to the present invention, the movable plate is laterally moved in one and the other directions through slippage provided by the conductive shoe to effect a contacting and releasing operation. It can effectively prevent the generation of static electricity caused by mutual friction between the movable plate formed of an insulator material and the socket body and effectively obviate the adverse effect of the static electricity on an electric part such as, IC, etc.

The above object and features of the present invention will become manifest to those skilled in the art from the following detailed description of the invention with reference to the drawings.

DETAILED DESCRIPTION OF THE EMBODIMENT

Figure 1:
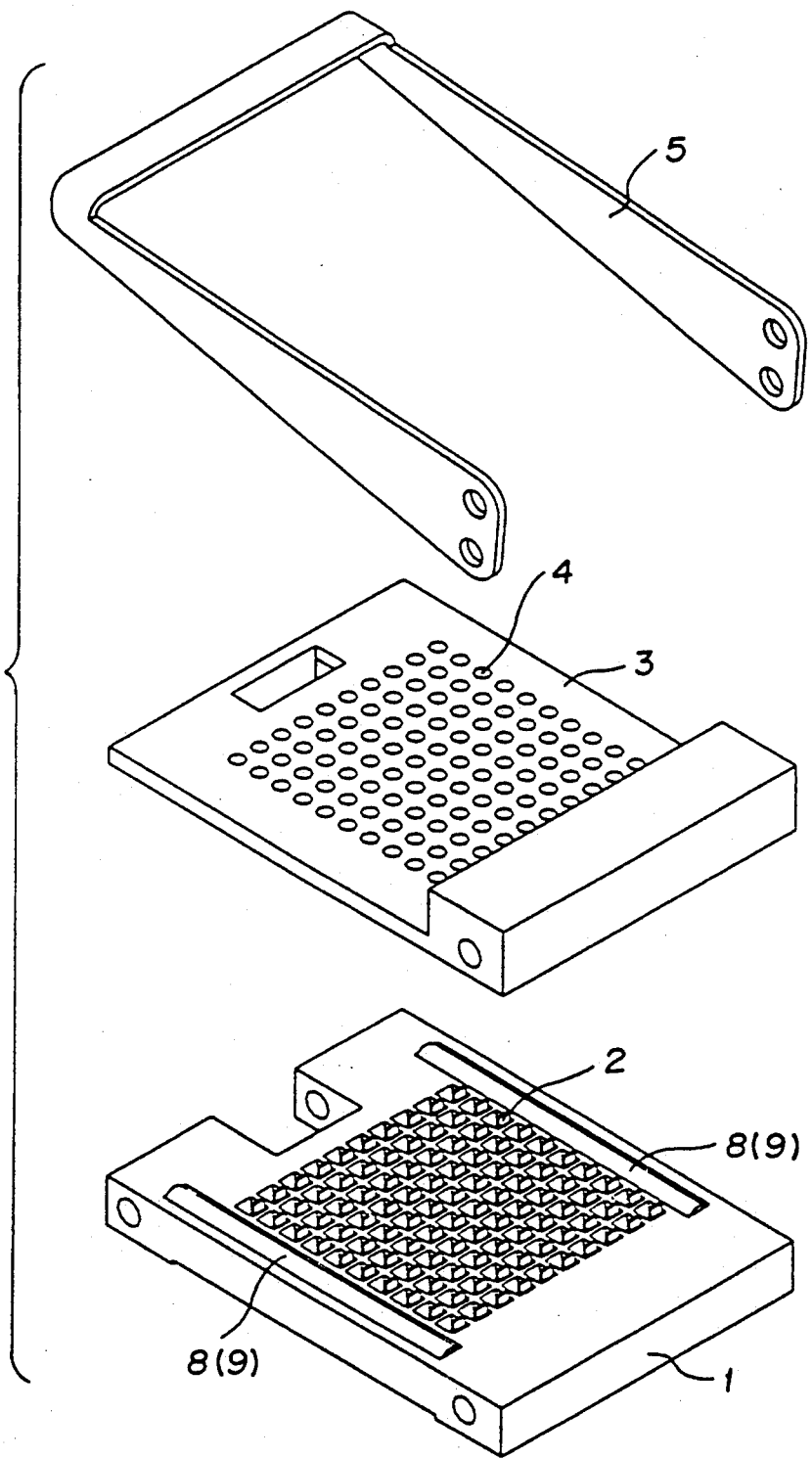
FIG. 1 is an exploded perspective view of a socket for an electric part showing one embodiment of the present invention.

Several embodiments of the present invention will be described hereinafter with reference to FIGS. 1 through 6.

The numeral 1 denotes a socket body formed of an insulator material. The socket body 1 includes a plurality of contacts 2 arranged thereon in such a manner as to be able to contact with an electric part such as IC, etc.

The numeral 3 denotes a contacting and releasing movable plate which is disposed on an upper surface of the socket body 1 and movable in the lateral direction along the upper surface. The movable plate 3 has a plurality of throughholes 4 through which terminals of an electric part mounted on the movable plate 3 extend so as to be contacted with the contacts 2. The numeral 5 denotes a lever ex-emplifying a moving operation means for the movable plate 3. One end of the lever 5 is separately supported by one end of the socket body 1 through shafts 6 and 7. By pivotally operating the other end of the lever 5 upward and downward, the shaft 7 on the movable plate 3 side is pivoted about the shaft 6. Depending on the direction of the pivotal movement of the shaft 7, the movable plate 3 is laterally moved in one or the other direction. In accordance with the lateral movement of the movable plate 3 in one direction, the terminals of the electric part are brought into contact with the contacts 2, and in accordance with the lateral movement of the movable plate 3 in the other direction, the contacting state between the terminals and the contacts is released.

As an effective countermeasure against static electricity in a socket for an electric part including the movable plate 3, in the present invention, a conductive shoe 8 is interposed between the socket body 1 and the movable plate 3 so that the movable plate 3 is laterally moved with slippage on the conductive shoe 8.

Figure 2:
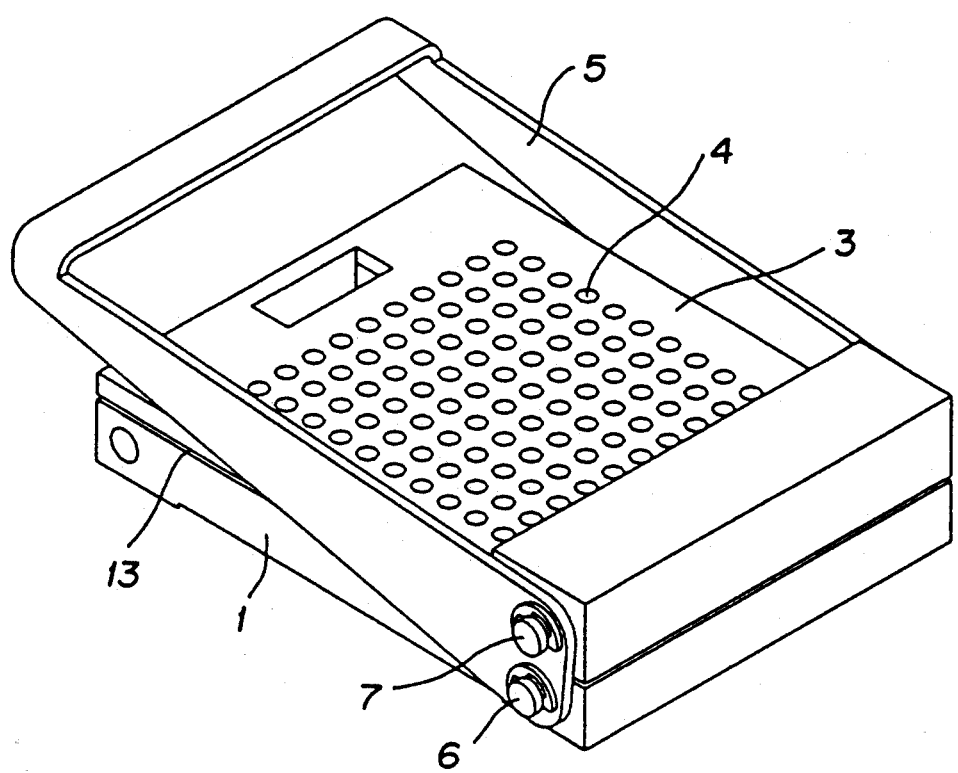
FIG. 2 is a perspective view showing the socket of FIG. 1 in an assembled state.
Figure 3:
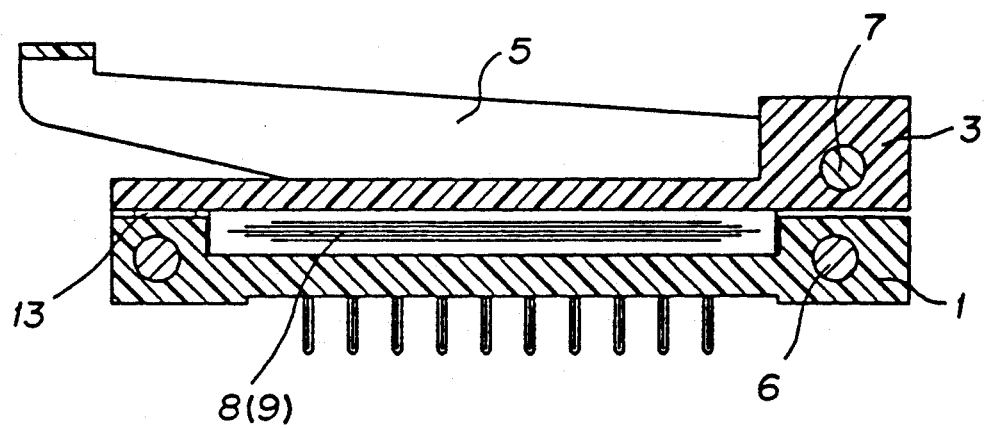
FIG. 3 is a sectional view thereof.

As one example of the above, in FIGS. 1 through 3, a round or cylindrical bar or a semicylindrical bar formed of a conductive material, that is, a bar 9 having an arcuate slipping surface in section, is interposed between the movable plate 3 and the socket body 1. For example, such bars 9 are embedded in parallel relation along both sides of the upper surface of the socket body 1 in such a manner as to extend in the moving direction of the movable plate 3 with the arcuate surface thereof exposed from the upper surface of the socket body 1. The movable plate 3, while being stably supported at both inner sides thereof by a pair of the bars 9, is laterally moved slippage on the arcuate surfaces of the conductive shoes 8 formed of the bars 9, to thereby effect contact and release.

Figure 4:
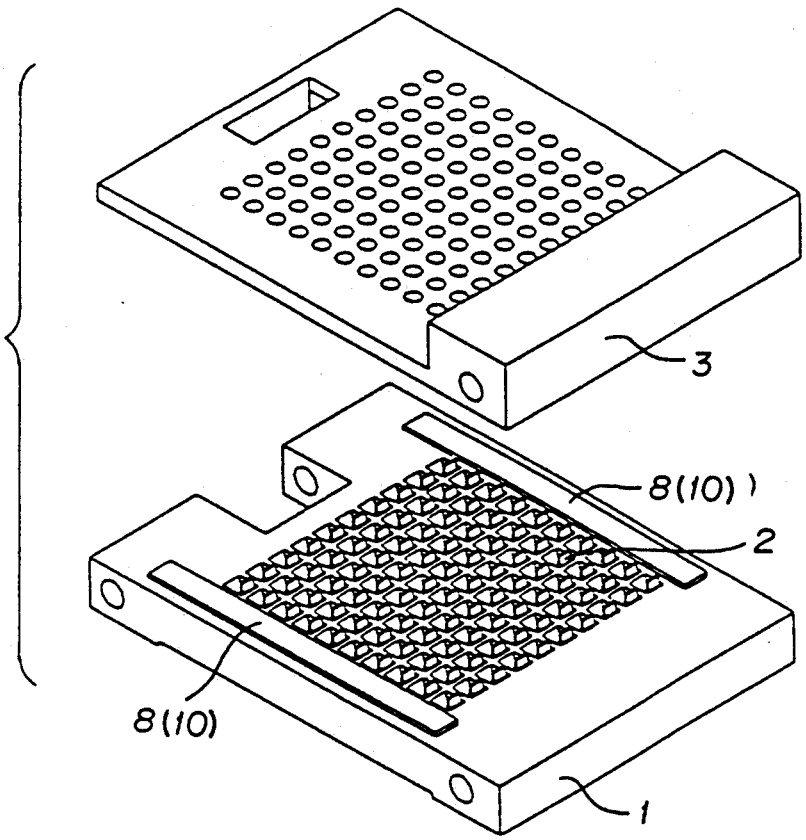
FIG. 4 is an exploded perspective view showing a modified embodiment of the socket body and a conductive shoe.

In FIG. 4, as another example of the conductive shoe 8, a strip plate or square cross-section bar 10 formed of an elongated conductive member having a flat slipping surface is used, and such plates or bars 10 are disposed in parallel relation along both sides of the upper surface of the socket body 1 as in the bars 9.

Figure 5:
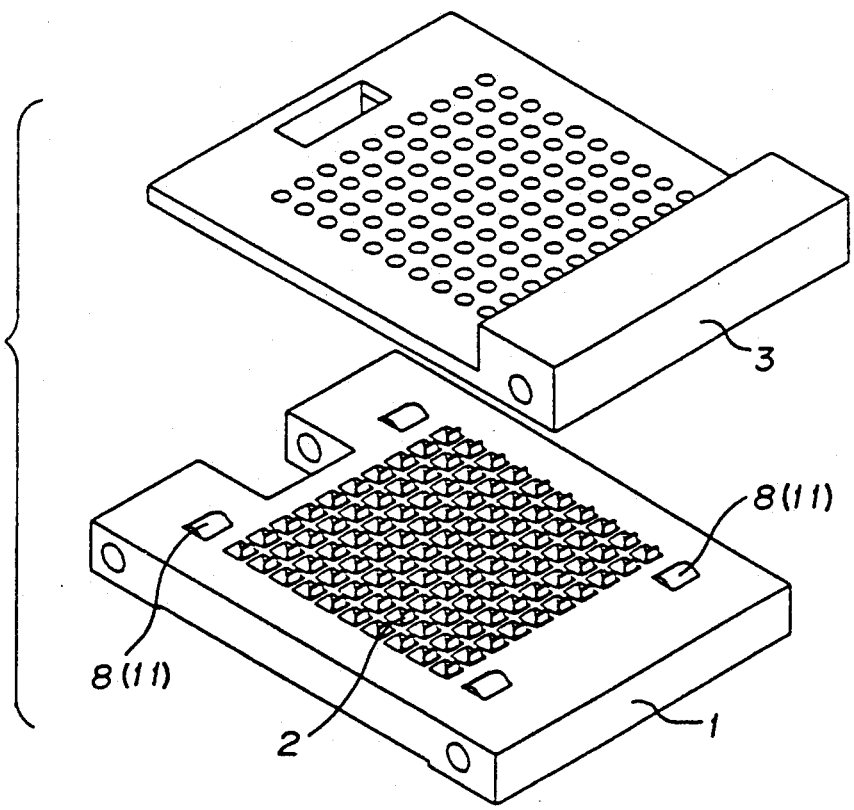
FIG. 5 is likewise an exploded perspective view showing still another modified embodiment of the socket body and a conductive shoe.
Figure 6:
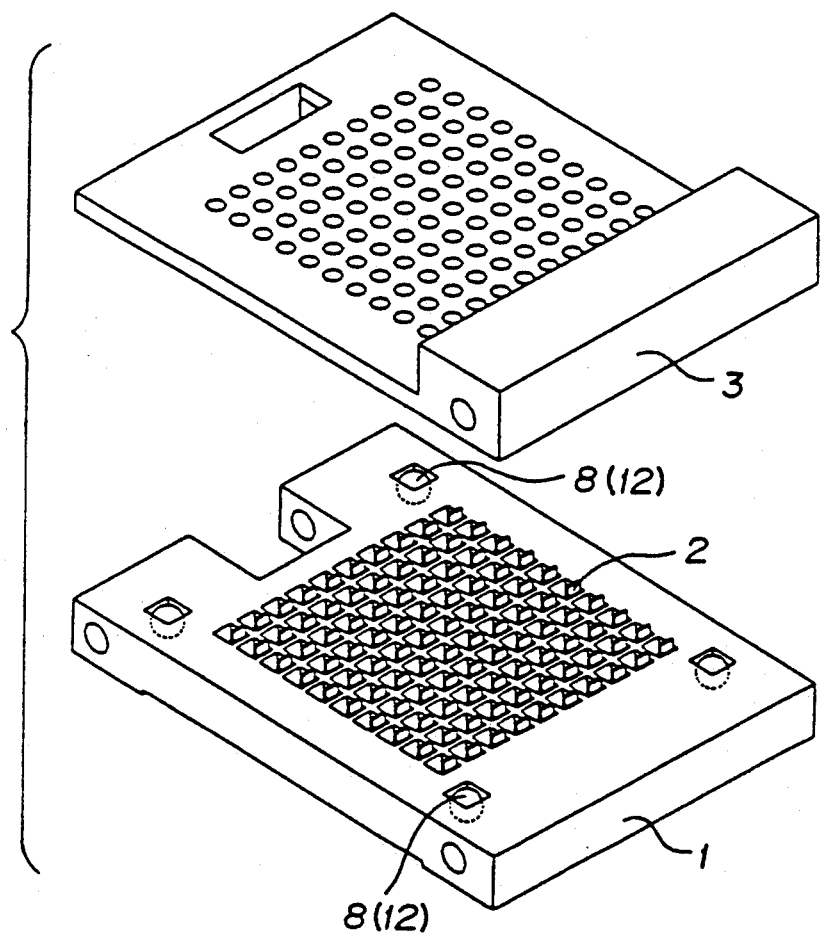
FIG. 6 is likewise an exploded perspective view showing yet another modified embodiment of the socket body and a conductive shoe.

In FIG. 5, a cylindrical rolling member 11 formed of a conductive material is used as the conductive shoe 8. Similarly, in FIG. 6, a spherical rolling member 12 is used as the conductive shoe 8. The rolling members 11 and 12, as shown in FIGS. 5 and 6, are arranged in a good balance at four corners, etc. of the upper surface of the socket body 1 in such a manner as to stably support the four corners of the movable plate 3 so that the movable plate 3 can be laterally moved while slipping thereon.

The rolling members 11 and 12, which are pivotably projected from the upper surface of the socket body 1, act as rolling means for enhancing a smooth lateral movement of the movable plate 3 and at the same time, they act as means for restraining the generation of static electricity as originally intended.

In the above described embodiments, a gap 13 is formed between the inner surface of the movable plate 3 and the socket body 1 by the conductive shoe 8 so that the movable plate 3 is supported in a floating state.

According to the present invention, since the movable plate is laterally moved through slippage of the conductive shoe, static electricity generated when the movable plate is laterally moved can be limited as much as possible. Therefore, it can effectively solve the conventional problem of generation of static electricity caused by friction between the movable plate and the socket body when the movable plate is laterally moved and effectively obviate the adverse effect exerted on an electric part such as IC, etc., by the static electricity.

Further, the present invention is very simple in structure as a countermeasure against static electricity, capable of being practiced at a low cost, and effective as means for permitting smoothly laterally moving the movable plate and as antiwear means.

Although the present invention has been illustrated and described in the form of the preferred embodiments, the invention is of course not limited to these embodiments. Many changes and modifications can be made within the spirit of the invention and are naturally included in the scope of the appended claims.

What is claimed is:
1. A socket for an electric part comprising:
a socket body formed of an insulator material and having a plurality of socket body contacts arranged in an area of said socket body and positioned so as to be contacted by terminals of an electric part;
a movable plate for receiving an electric part with a plurality of terminals and positioned above an upper surface of said socket body in such a manner as to direct the plurality of terminals into the socket body contacts and to be movable laterally along said upper surface, a lateral movement in one direction forming a contacting state between corresponding contacts and terminals and a lateral movement in an opposite direction releasing said contacts and terminals from said contacting state; and
a conductive shoe means interposed between said socket body and said movable plate and in an area other than the area of the socket body in which the contacts are arranged, said conductive shoe means supporting said movable plate in spaced relationship with said socket body above said socket body and allowing said movable plate to slip along said socket body when said movable plate is laterally moved.

2. A socket as claimed in claim 1 in which said shoe means is at least one elongated conductive member extending in the direction of lateral movement of said movable plate.

3. A socket as claimed in claim 1 in which said shoe means is at least one cylindrical rolling member mounted on said socket body with the peripheral surface thereof movable in the direction of lateral movement of said movable plate.

4. A socket body as claimed in claim 1 in which said shoe means is at least one spherical rolling member.

* * * * *